United States Patent
Gaddi et al.

(10) Patent No.: US 11,476,245 B2
(45) Date of Patent: Oct. 18, 2022

(54) ESD PROTECTION OF MEMS FOR RF APPLICATIONS

(71) Applicant: CAVENDISH KINETICS, INC., San Jose, CA (US)

(72) Inventors: Roberto Gaddi, Rosmalen (NL); James Douglas Huffman, McKinney, TX (US); Chenhui Niu, San Jose, CA (US); Ray Parkhurst, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 396 days.

(21) Appl. No.: 15/771,245

(22) PCT Filed: Nov. 14, 2016

(86) PCT No.: PCT/US2016/061933
§ 371 (c)(1),
(2) Date: Apr. 27, 2018

(87) PCT Pub. No.: WO2017/087338
PCT Pub. Date: May 26, 2017

(65) Prior Publication Data
US 2018/0315748 A1    Nov. 1, 2018

Related U.S. Application Data

(60) Provisional application No. 62/256,026, filed on Nov. 16, 2015.

(51) Int. Cl.
*H01L 27/02* (2006.01)
*H01H 1/00* (2006.01)
(Continued)

(52) U.S. Cl.
CPC ............ *H01L 27/0292* (2013.01); *B81B 7/02* (2013.01); *H01H 1/0036* (2013.01); *H01H 9/54* (2013.01);
(Continued)

(58) Field of Classification Search
None
See application file for complete search history.

(56) References Cited

U.S. PATENT DOCUMENTS 6,567,251 B1    5/2003  Schulte et al.
7,529,017 B1 *  5/2009  Walker ................ B81C 1/00976
                                             359/290

(Continued)

FOREIGN PATENT DOCUMENTS

JP    2008278147 A    11/2008
JP    2012019307 A     1/2012
(Continued)

OTHER PUBLICATIONS

Decision on Rejection for Chinese Patent Application No. 201680066404.8, dated Mar. 20, 2020, 16 pages.
(Continued)

*Primary Examiner* — Jeffrey A Gblende
(74) *Attorney, Agent, or Firm* — Withrow & Terranova, P.L.L.C.

(57) ABSTRACT

The present disclosure generally relates to the combination of MEMS intrinsic technology with specifically designed solid state ESD protection circuits in state of the art solid state technology for RF applications. Using ESD protection in MEMS devices has some level of complexity in the integration which can be seen by some as a disadvantage. However, the net benefits in the level of overall performance for insertion loss, isolation and linearity outweighs the disadvantages.

15 Claims, 10 Drawing Sheets

(51) Int. Cl.
*H01H 59/00* (2006.01)
*B81B 7/02* (2006.01)
*H01H 9/54* (2006.01)

(52) U.S. Cl.
CPC ..... *H01H 59/0009* (2013.01); *H01L 27/0248* (2013.01); *H01L 27/0296* (2013.01); *B81B 2207/99* (2013.01); *H01H 2001/0084* (2013.01); *H01H 2239/008* (2013.01)

(56) References Cited

U.S. PATENT DOCUMENTS

| | | | | |
|---|---|---|---|---|
| 7,864,491 | B1* | 1/2011 | Bauder | H01H 9/542 361/13 |
| 2003/0214373 | A1 | 11/2003 | Andricacos et al. | |
| 2005/0156695 | A1 | 7/2005 | Andricacos et al. | |
| 2007/0057746 | A1 | 3/2007 | Rubel | |
| 2010/0051428 | A1 | 3/2010 | Ikehashi | |
| 2010/0126834 | A1* | 5/2010 | Ikehashi | G11C 23/00 200/181 |
| 2011/0068421 | A1* | 3/2011 | Kwa | G01L 19/069 257/416 |
| 2013/0207714 | A1* | 8/2013 | Bauder | H04W 52/02 327/516 |
| 2014/0015731 | A1 | 1/2014 | Khlat et al. | |

FOREIGN PATENT DOCUMENTS

| | | |
|---|---|---|
| WO | 2015017743 A1 | 2/2015 |
| WO | 2015160723 A1 | 10/2015 |
| WO | WO-2015160723 A1 * 10/2015 ......... B81C 1/00341 |

OTHER PUBLICATIONS

International Search Report and Written Opinion for International Patent Application No. PCT/US2016/061933, dated Feb. 24, 2017, 9 pages.
International Preliminary Report on Patentability issued in corresponding International Application No. PCT/US2016/061933, dated May 22, 2018 (7 pages).
Search Report issued in corresponding Chinese Patent Application No. 2016800664048, dated Feb. 15, 2019 (3 pages).
Office Action issued in corresponding Chinese Patent Application No. 2016800664048, dated Feb. 28, 2019 (23 pages).
Office Action issued corresponding Chinese Patent Application No. 2016800664048, dated Sep. 4, 2019 (18 pages).
Notification of Reexamination for Chinese Patent Application No. 201680066404.8, dated Jan. 5, 2021, 17 pages.
Notification of Reasons for Refusal for Japanese Patent Application No. 2018-525395, dated Oct. 20, 2020, 12 pages.
Decision on Reexamination for Chinese Patent Application No. 201680066404.8, dated Mar. 19, 2021, 16 pages.
Examination Report for European Patent Application No. 16802221.8, dated Apr. 26, 2021, 6 pages.
Decision to Grant for Japanese Patent Application No. 2018-525395, dated Apr. 6, 2021, 5 pages.

* cited by examiner

ESD PROTECTION OF MEMS FOR RF APPLICATIONS

BACKGROUND OF THE DISCLOSURE

Field of the Disclosure

Embodiments of the present disclosure generally relate to a micro electromechanical systems (MEMS) device for reducing risk of electro-static discharge (ESD).

Description of the Related Art

Devices including MEMS technology which have been designed and manufactured for applications in radio frequency telecommunications where risk of electro-static discharge is present, both during the manufacturing process (e.g. assembly) and in the typical usage conditions of the device (e.g. exposure to electrically charged human body). In particular, components such switches and tunable capacitors used to enable reconfigurable analog and mixed-signal circuits for state-of-the-art wireless devices.

ESD protection devices and circuits are an essential part of the solid state technology enabling electronic components and circuits. These solutions come with a significant performance penalty when applied to radio-frequency components. Key metrics such as insertion loss, isolation, linearity are significantly degraded when standard ESD protection techniques are used. MEMS technology can enable unprecedented performance levels when applied to the implementation of radio-frequency components such as switches and variable capacitors. But traditional ESD protection techniques would degrade such performance to unacceptable levels.

There is a need in the industry for new ESD solutions for MEMS based components that are able to maintain a high level of RF performance.

SUMMARY OF THE DISCLOSURE

The present disclosure generally relates to the combination of MEMS intrinsic technology with specifically designed solid state ESD protection circuits in state of the art solid state technology for RF applications. Using ESD protection in MEMS devices has some level of complexity in the integration which can be seen by some as a disadvantage. However, the net benefits in the level of overall performance for insertion loss, isolation and linearity outweighs the disadvantages.

In one embodiment, a device comprises a plurality of MEMS devices connected in parallel with a common RF electrode, wherein the MEMS devices are disposed, electrically, between the RF electrode and ground; and a first ESD device coupled in parallel to the plurality of MEMS devices between the RF electrode and ground.

In another embodiment, a device, comprises a plurality of MEMS devices connected in parallel with a common first RF electrode, wherein the MEMS devices are disposed, electrically, between the first RF electrode and a second RF electrode; and a first ESD device coupled between the second RF electrode and ground.

In another embodiment, a device comprises a plurality of MEMS devices connected in parallel with a first RF electrode, wherein each MEMS device has a corresponding second electrode; and a ESD device coupled between the first RF electrode and ground.

In another embodiment, a device comprises a SOI semiconductor die; a plurality of pairs of connection pads coupled to the die; and an ESD device coupled between the connection pads of each pair of connection pads.

In another embodiment, a device comprises a plurality of MEMS devices connected in parallel between a first RF electrode and a second RF electrode; a first ESD device coupled between the first RF electrode and ground; and a second ESD device coupled between the second RF electrode and ground.

In another embodiment, a device comprises a first RF electrode; a plurality of second RF electrodes, wherein a switch is present between each second RF electrode and the first RF electrode; a first ESD device coupled between each second RF electrode and each switch; a second ESD device coupled between each switch and the first RF electrode; and a third ESD device coupled between ground and each first ESD device and the second ESD device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to the combination of MEMS intrinsic technology with specifically designed solid state ESD protection circuits in state of the art solid state technology for RF applications. Using ESD protection in MEMS devices has some level of complexity in the integration which can be seen by some as a disadvantage. However, the net benefits in the level of overall performance for insertion loss, isolation and linearity outweighs the disadvantages.

Figure 1A:
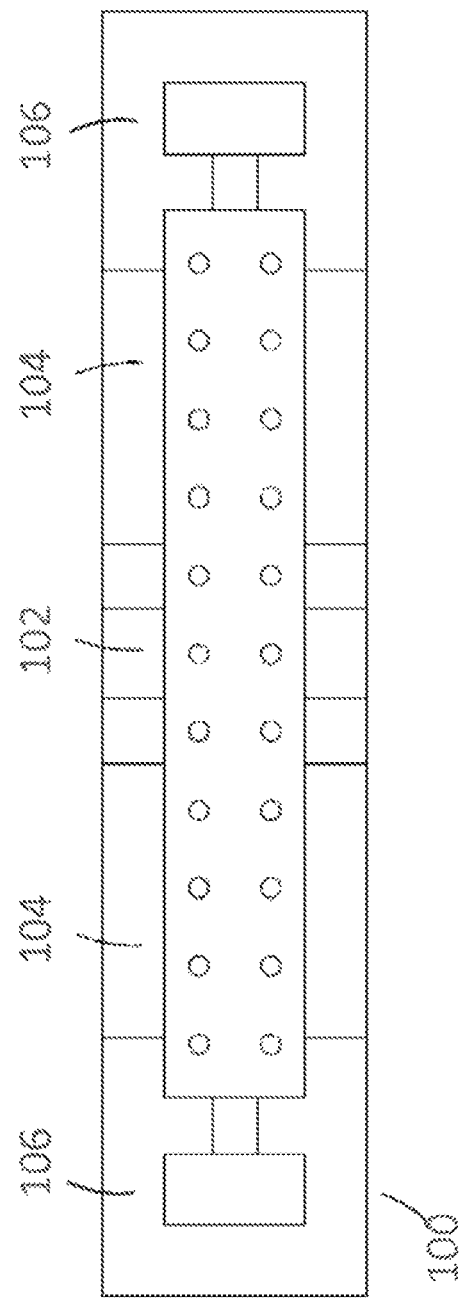
FIG. 1A is a schematic top-view of an ohmic MEMS switch.

FIG. 1A is a schematic top-view of an ohmic MEMS switch 100. The switch 100 contains an RF-electrode 102, pull-down electrodes 104 and anchor electrodes 106. When a sufficiently high voltage is applied to the pull-down electrodes 104, the MEMS switch is actuated down and forms an ohmic connection between the RF-electrode 102 and anchor electrodes 106

Figure 1B:
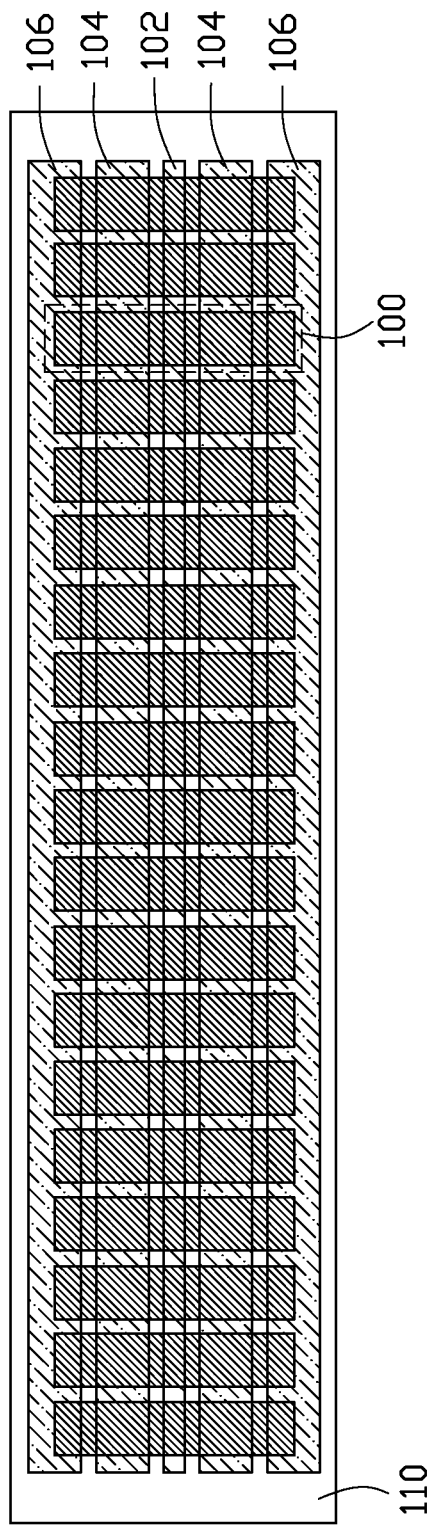
FIG. 1B is a schematic top view of an ohmic switch cell containing a number of parallel operated MEMS switches.

FIG. 1B is a schematic top view of an ohmic switch cell 110 containing a number of MEMS switches 100. All MEMS switches 100 in the cell 110 are turned on at the same time by applying a high-enough voltage on the pulldown-electrodes 104. Because many switches are operated in parallel, the resistance between the RF-electrode 102 and anchor electrodes 106 is reduced.

Figure 1C:
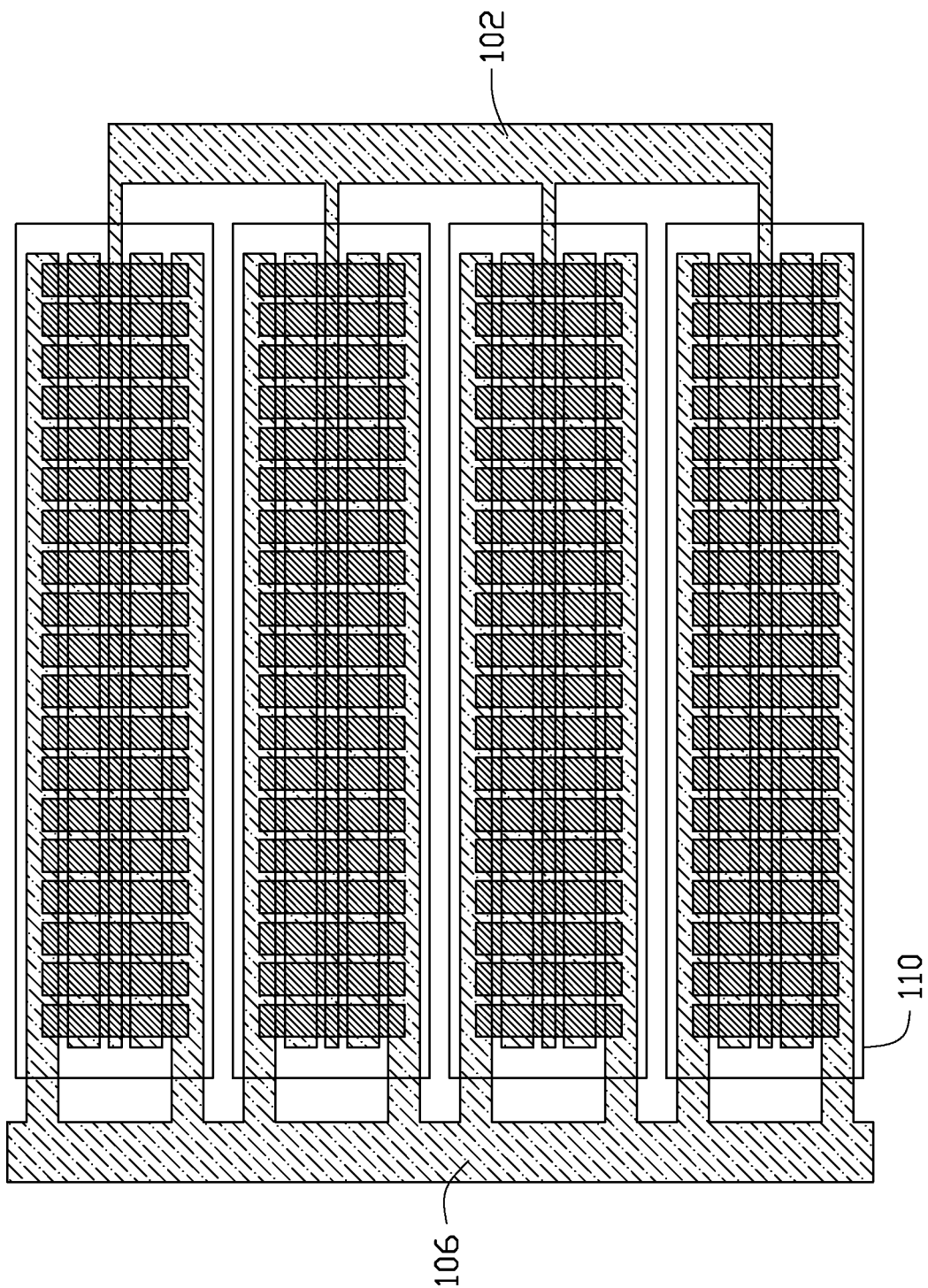
FIG. 1C is a schematic top view of an ohmic switch array containing a number of parallel operated switch-cells.

FIG. 1C shows a schematic top-view of an ohmic switch-array. It contains a number of parallel operated switch-cells 110. The RF-electrodes 102 of each cell are connected together at one end of each switch-cell 110, while the anchor-electrodes 106 are connected together at the other end of each switch-cell 110. When all cells are turned on this results in a further reduction of the resistance between the RF-electrode 102 and anchor electrode 106. At the same time, because many switches are operated in parallel the total switch-array can handle more current.

Figure 2:
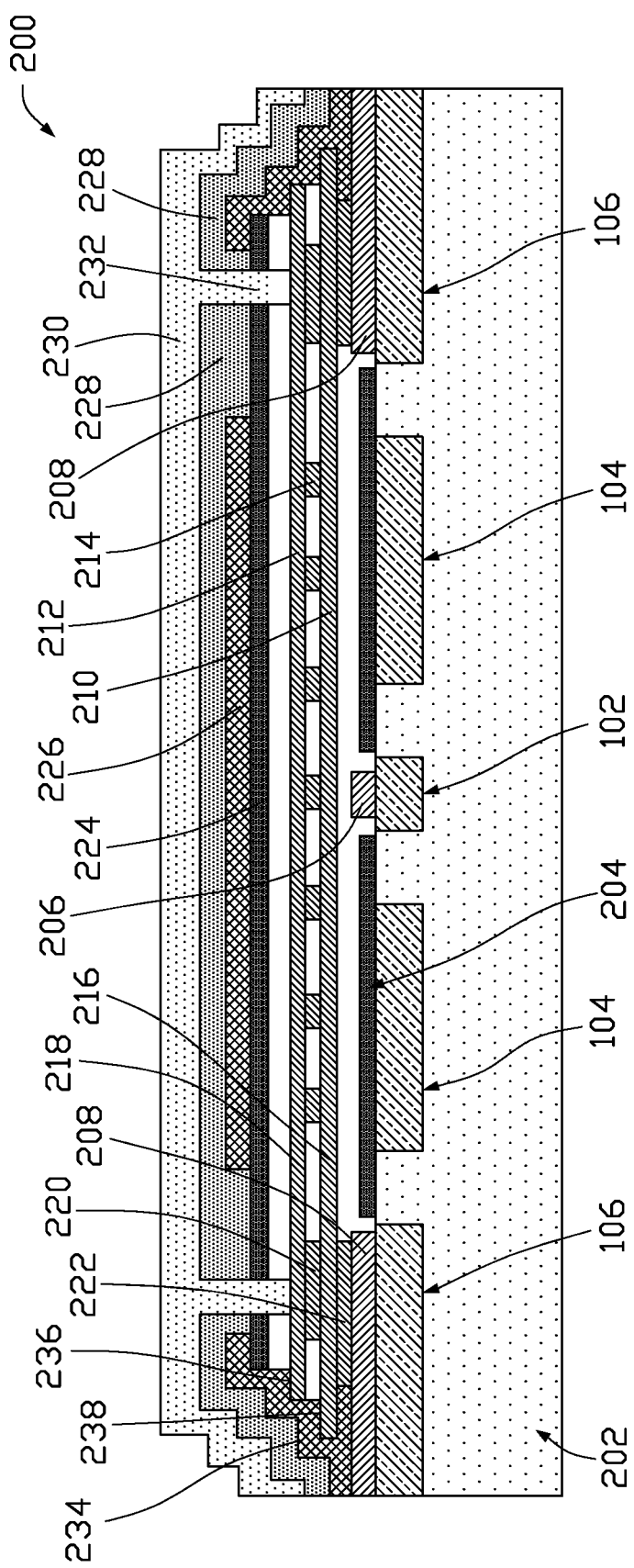
FIG. 2 is a schematic cross-sectional view of a MEMS ohmic switch according to one embodiment.
Figures 3A, 3B, 3C, 3D:
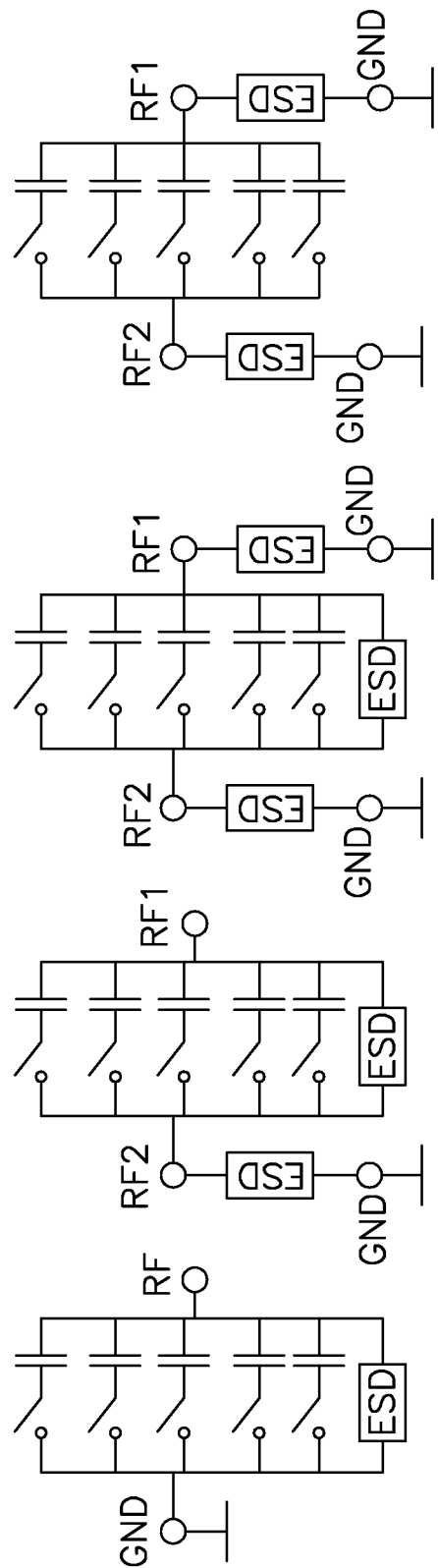
FIGS. 3A-3G exemplify several embodiments of an ESD coupled to a RF electrode of a MEMS device.
Figure 3E:
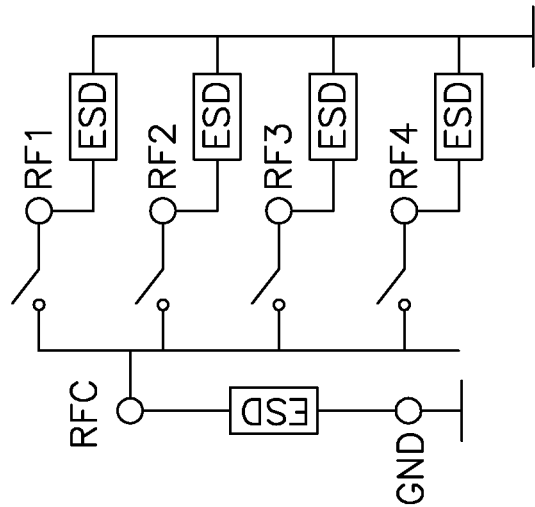
Figure 3F:
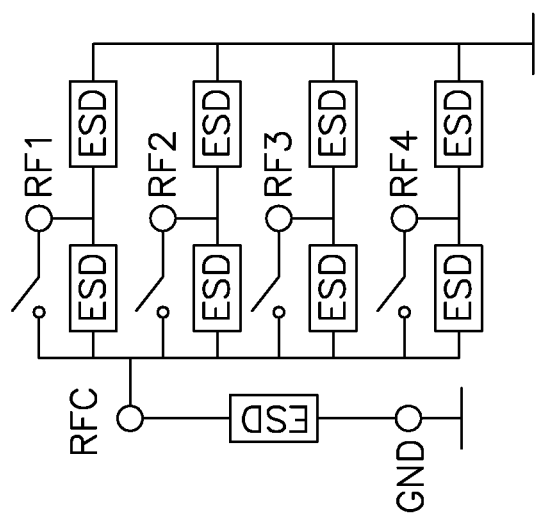
Figure 3G:
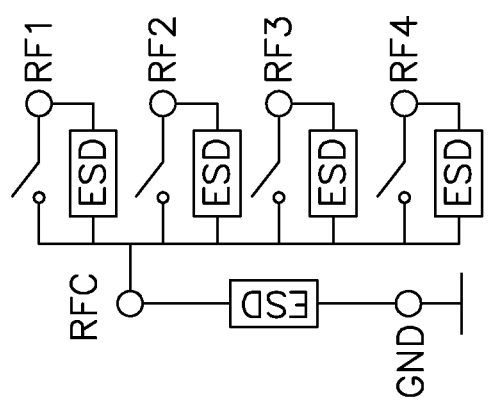

FIG. 2 shows a cross-section view of an ohmic MEMS switch 200. This disclosure describes a method of improving the current handling capability of the MEMS leg-suspension and anchor. The MEMS switch 200 contains an RF electrode 102, pull-down electrodes 104 and anchor electrodes 106 located on substrate 202. The pull-down electrodes 104 are covered with a dielectric layer 204 to avoid a short-circuit between the MEMS switch and the pull-down electrode 104 in the pulled-down state. Suitable materials for the electrically insulating or dielectric layer 204 include silicon based materials including silicon-oxide, silicon-dioxide, silicon-nitride and silicon-oxynitride. The thickness of this layer 204 is typically in the range of 50 nm to 150 nm to limit the electric field in the dielectric layer. On top of the RF electrode 102 is the RF contact 206 to which the switch body forms an ohmic contact in the pulled-down state. On top of the anchor-electrode 106 is the anchor contact 208 to which the MEMS device is anchored. Typical materials used for the contacting layers 206, 208 include Ti, TiN, TiAl, TiAlN, AlN, Al, W, Pt, Ir, Rh, Ru, $RuO_2$, ITO and Mo and combinations thereof.

The switch element contains a stiff bridge consisting of conductive layers 210, 212 which are joined together using an array of vias 214. This allows for a stiff plate-section and compliant legs to provide a high contact-force while keeping the operating voltage to acceptable levels. The MEMS bridge is suspended by legs 216 formed in the lower layer 210 and legs 218 formed in the upper layer 212 of the MEMS bridge. The upper layer of the MEMS bridge is anchor to the lower layer of the MEMS with via 220. The lower layer of the MEMS bridge is anchored to the anchor contact 208 with via 222. Current that is injected from the RF contact 206 into the MEMS bridge when the MEMS switch is actuated down flows out through the MEMS-bridge in both directions to the anchor electrodes 106 located on either side of the switch-body. The current handling of the switch is improved by using legs 216, 218 in both layers 210, 212 of the MEMS bridge instead of just a single layer. Because these legs are not joined together with vias 214 like in the MEMS-bridge the compliance of these legs is still low enough to allow for reasonable operating voltages to pull the MEMS bridge 210, 212 in contact with the RF contact 206.

Above the MEMS bridge there is a dielectric layer 224 which is capped with metal pull-up electrode 226 which is used to pull the MEMS up to the roof for the off state. Dielectric layer 224 avoids a short-circuit between the MEMS bridge and the pull-up electrode 226 in the actuated-up state and limits the electric fields for high reliability. Moving the device to the top helps reduce the capacitance of the switch to the RF-electrode 102 in the off state. The cavity roof further contains an additional dielectric layer 228 for mechanical strength. The cavity is sealed with dielectric layer 230 which fills the etch release holes 232 used to remove the sacrificial layers which are present during fabrication. The dielectric layer 230 enters the etch release holes 232 and provides a further mechanical support to the top-layer 212 of the MEMS-bridge in the anchors, while also sealing the cavity so that there is a low pressure environment in the cavity. Suitable materials for the roof dielectric layers 228, 230 include silicon based materials including silicon-oxide, silicon-dioxide, silicon-nitride and silicon-oxynitride.

The same conductive layer which is used for the pull-up electrode 226 is also used at the sides of the cavity at 234 where it connects to the top-layer 212 of the MEMS-bridge at 236, to the bottom-layer 210 of the MEMS-bridge at location 238 and to the anchor contact 208. Thus this sidewall electrical connection provides for a current path from the MEMS bridge 210, 212 to the anchor contact 208 in parallel with the MEMS-bridge vias 220, 222 and increases the current handling capability of the MEMS anchor.

In this disclosure, from an architectural stand point, a series of topologies for combining a unit ESD protection element with a MEMS tunable capacitor or switch is disclosed. Depending on the component and the pinout, one or multiple ESD protection elements are inserted and properly connected in order to avoid disruptive electrical voltages and currents within the MEMS switch elements. FIGS. 3A-3G exemplify several possibilities.

The ESD protection elements is implemented in solid state technologies that offer the best performance in terms of loss, isolation and linearity, such as Silicon-on-Insulator (SOI). The implemented ESD circuit is passive (i.s., requires no power) as the ESD circuit is supposed to "turn-on" with the energy provided by an ESD event. In normal application conditions, the ESD circuit provides minimum amount of loading for the intrinsic MEMS circuit, in terms of very small electrical capacitances and leakage currents.

Figure 4:
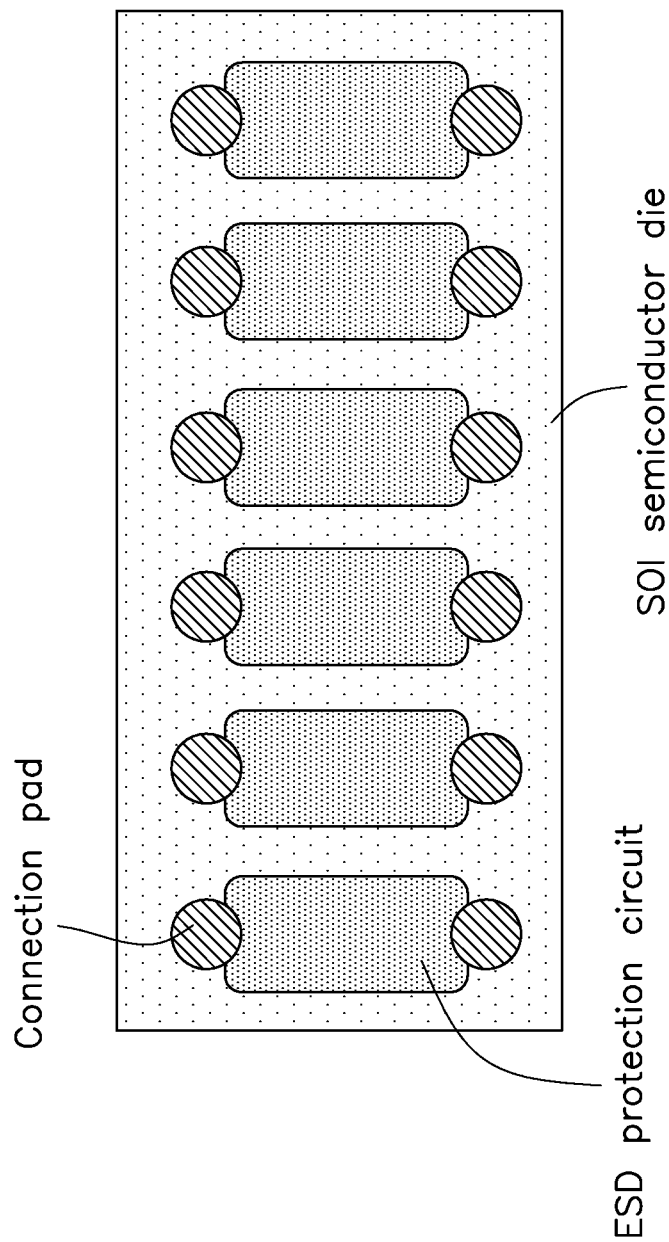
FIG. 4 shows multiple ESD elements on a single die according to one embodiment.

Several ESD elements may be included on a single die as shown in FIG. 4. Several ESD elements on a single die allows for flexibility in terms of how many ESD elements are needed given the particular MEMS device to be protected. From an integration standpoint, the component includes separate substrates for the MEMS intrinsic part and for the SOI ESD protection circuit. These are combined within the same miniature package. With this approach, the same ESD circuit can be re-utilized within many different components, with reduced costs and complexity.

Figure 5:
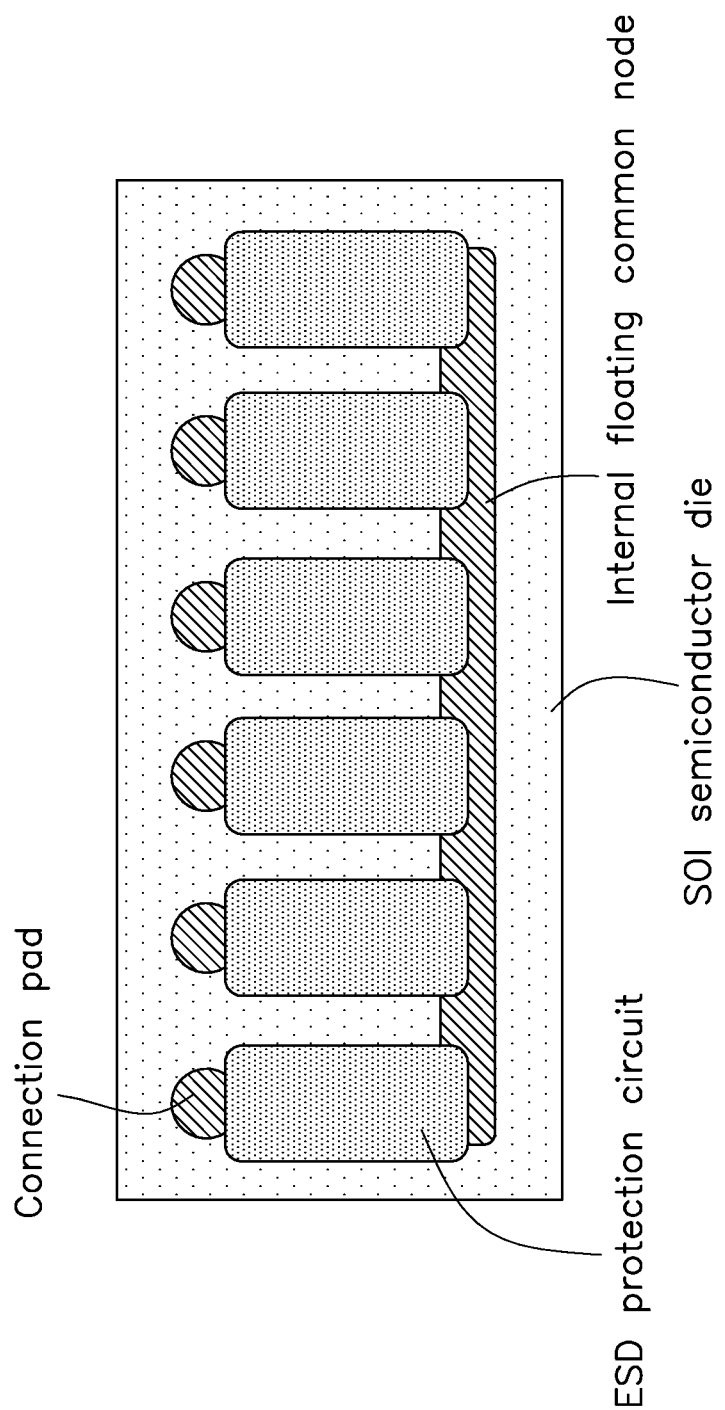
FIG. 5 shows multiple ESD elements on a single die according to another embodiment.

In a different novel implementation, the ESD circuit architecture is such that a wide range of products can be protected using the same ESD chip. This added flexibility is provided by having an internal "floating" node in the ESD circuit chip. Any pair of nodes in the final MEMS device can be protected by being connected to any pair of IO's of the ESD chip such as shown in FIG. 5.

Figure 6A:
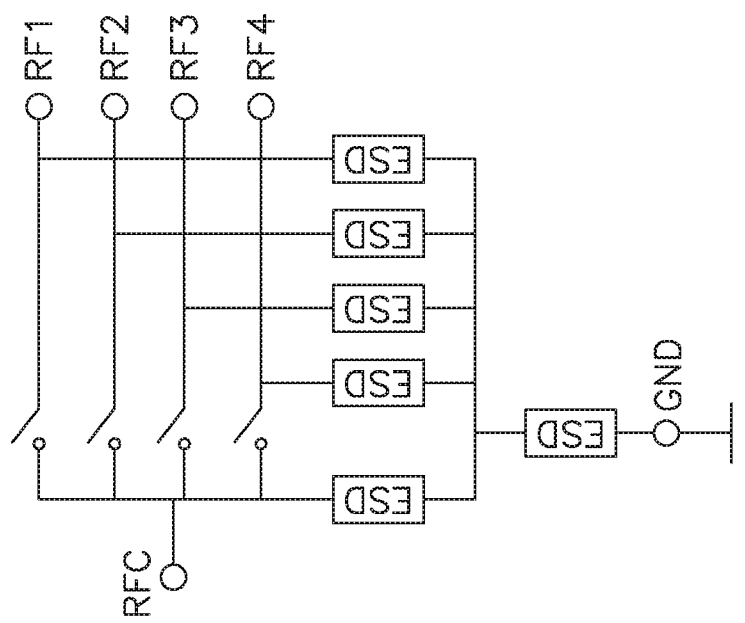
FIGS. 6A and 6B show two examples of architectures where a variable capacitor (tuner) and four pole switches have been ESD protected using the same ESD circuit implemented with an internal floating common node.
Figure 6B:
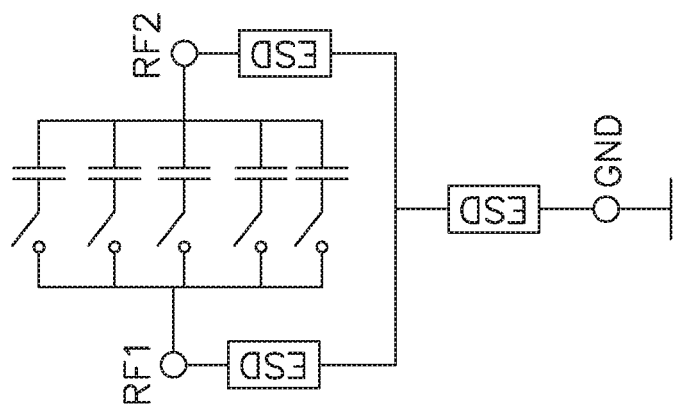

FIGS. 6A and 6B show two examples of architectures where a variable capacitor (tuner) and four pole switches have been ESD protected using the same ESD circuit implemented with an internal floating common node.

Figure 7:
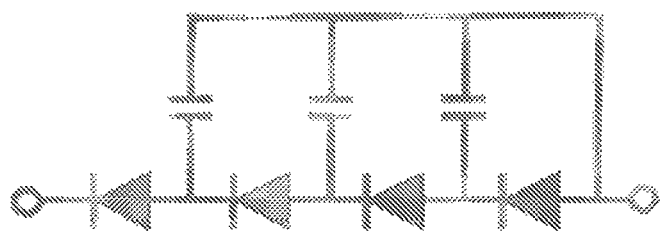
FIG. 7 shows a cascading circuit for ESD protection according to one embodiment.

Additionally, the implementation of timing control to protect the ESD IC from turning on too fast and blowing up during the IEC ESD event is disclosed. As an example, a capacitive cascade is shows below which provides the required time delay before the ESD protection circuit turns on, avoiding large but very fast current spikes typical for IEC ESD events from damaging the circuit as shown in FIG. 7.

By using ESD protection with MEMS intrinsic technology the level of overall performance for insertion loss, isolation and linearity improves greatly.

While the foregoing is directed to embodiments of the present disclosure, other and further embodiments of the disclosure may be devised without departing from the basic scope thereof, and the scope thereof is determined by the claims that follow.

The invention claimed is:

1. A device, comprising:
a plurality of micro-electromechanical systems (MEMS) devices connected in parallel between a radio frequency (RF) electrode and ground, wherein each of the plurality of MEMS devices is configured to be switched at a same time by applying a voltage to a common pull-down electrode; and
a first electrostatic discharge (ESD) device coupled in parallel to the plurality of MEMS devices between the RF electrode and ground, wherein the plurality of MEMS devices are arranged on a substrate and the first ESD device is an element that is positioned separate from the substrate.

2. A device, comprising:
a plurality of micro-electromechanical systems (MEMS) devices connected in parallel between a first radio frequency (RF) electrode and a second RF electrode, wherein each of the plurality of MEMS devices is configured to be switched at a same time by applying a voltage to a common pull-down electrode; and
a first electrostatic discharge (ESD) device coupled between the second RF electrode and ground, wherein the plurality of MEMS devices are arranged on a substrate and the first ESD device is an element that is positioned separate from the substrate.

3. The device of claim 2, further comprising a second ESD device coupled in parallel to the plurality of MEMS devices between the first RF electrode and the second RF electrode.

4. The device of claim 3, further comprising a third ESD device connected between ground and the first RF electrode.

5. The device of claim 2, further comprising a second ESD device connected between ground and the first RF electrode.

6. The device of claim 1, wherein the first ESD device is arranged on a second substrate.

7. The device of claim 6, wherein the second substrate comprises a plurality of pairs of connection pads, wherein the first ESD device and a first MEMS device of the plurality of MEMS devices are coupled between a first pair of the plurality of pairs of connection pads.

8. The device of claim 6, wherein the second substrate comprises a plurality of connection pads and a floating common node, wherein the first ESD device and a first MEMS device of the plurality of MEMS devices are coupled between one of the plurality of connection pads and the floating common node.

9. The device of claim 1, further comprising a timing control circuit coupled to the first ESD device.

10. A device, comprising:
a plurality of micro-electromechanical systems (MEMS) devices, wherein each MEMS device of the plurality of MEMS devices is connected in parallel between a first radio frequency (RF) electrode and a second RF electrode, wherein each of the plurality of MEMS devices is configured to be switched at a same time by applying a voltage to a common pull-down electrode; and
a first electrostatic discharge (ESD) device coupled between the first RF electrode and ground, wherein the plurality of MEMS devices are arranged on a substrate and the first ESD device is an element that is positioned separate from the substrate.

11. The device of claim 10, wherein each MEMS device includes a second ESD device coupled in parallel between the first RF electrode and the corresponding second RF electrode.

12. The device of claim 11, wherein each MEMS device includes a third ESD device coupled between the second RF electrode and ground.

13. The device of claim 10, wherein each MEMS device includes a second ESD device coupled between the second RF electrode and ground.

14. A device, comprising:
a plurality of micro-electromechanical systems (MEMS) devices connected in parallel between a first radio frequency (RF) electrode and a second RF electrode, wherein each of the plurality of MEMS devices is configured to be switched at a same time by applying a voltage to a common pull-down electrode;
a first electrostatic discharge (ESD) device coupled between the first RF electrode and ground; and
a second ESD device coupled between the second RF electrode and ground, wherein the plurality of MEMS devices are arranged on a substrate and the first ESD device and the second ESD device are provided as elements that are positioned separate from the substrate.

15. A device, comprising:
a first radio frequency (RF) electrode;
a plurality of second RF electrodes, wherein a switch is present between each second RF electrode and the first RF electrode;
a first electrostatic discharge (ESD) device coupled between each second RF electrode and each switch;
a second ESD device coupled between each switch and the first RF electrode; and
a third ESD device serially coupled between ground and each first ESD device and the second ESD device, wherein a plurality of micro-electromechanical systems (MEMS) devices are arranged on a substrate and the first ESD device, the second EDS device, and the third ESD device are provided as elements that are positioned separate from the substrate.

* * * * *